(12) United States Patent
Nobunaga et al.

(10) Patent No.: US 7,130,227 B2
(45) Date of Patent: Oct. 31, 2006

(54) ADJUSTABLE TIMING CIRCUIT OF AN INTEGRATED CIRCUIT

(75) Inventors: Dean Nobunaga, Sunnyvale, CA (US); Frankie F. Roohparvar, Miltitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/217,921

(22) Filed: Sep. 1, 2005

(65) Prior Publication Data

US 2005/0286338 A1 Dec. 29, 2005

Related U.S. Application Data

(60) Division of application No. 10/931,427, filed on Sep. 1, 2004, which is a continuation of application No. 09/648,857, filed on Aug. 25, 2000, now Pat. No. 6,877,100.

(51) Int. Cl.
    *G11C 15/02* (2006.01)
(52) U.S. Cl. ...................................... 365/194; 365/149
(58) Field of Classification Search ................ 365/194, 365/149, 189.05
    See application file for complete search history.

(56) References Cited

U.S. PATENT DOCUMENTS

| | | |
|---|---|---|
| 5,041,886 A | 8/1991 | Lee |
| 5,434,523 A | 7/1995 | Sundstrom |
| 5,537,354 A | 7/1996 | Mochizuki et al. |
| 5,600,605 A | 2/1997 | Schaefer |
| 5,666,321 A | 9/1997 | Schaefer |
| 5,751,039 A | 5/1998 | Kauffman et al. |
| 5,787,457 A | 7/1998 | Miller et al. |
| 5,845,109 A | 12/1998 | Suzuki et al. |

(Continued)

FOREIGN PATENT DOCUMENTS

JP 2000251472 A 9/2000

OTHER PUBLICATIONS

IBM Technical Disclosure Bulletin, "Delay Unit". Sep. 1989, vol. 32 Issue 4A. pp. 408-409.

(Continued)

*Primary Examiner*—Vu A. Le
(74) *Attorney, Agent, or Firm*—Leffert Jay & Polglaze, PA (57) ABSTRACT

An adjustable timing circuit includes non-volatile programmable fuses and adjustable delay elements. A propagation time of the delay element is selected with the non-volatile fuses. The delay element can include capacitors that are selectively coupled to a propagation path in response to the data stored in the fuse circuits. In one embodiment, data stored in the programmed fuses is copied to volatile latch circuits for use during operation of the timing circuit. The adjustable timing circuit can be provided in any integrated circuit, but is particularly useful in memory devices. The timing system allows for testing and fine-tuning signal processing in the integrated circuits.

15 Claims, 7 Drawing Sheets

U.S. PATENT DOCUMENTS

| | | | |
|---|---|---|---|
| 5,936,903 A | 8/1999 | Jeng et al. | |
| 5,936,977 A | 8/1999 | Churchill et al. | |
| 5,952,857 A | 9/1999 | Suzuki | |
| 5,995,438 A | 11/1999 | Jeng et al. | |
| 6,026,465 A | 2/2000 | Mills et al. | |
| 6,067,648 A | 5/2000 | Hunter et al. | |
| 6,073,053 A | 6/2000 | Dummermuth | |
| 6,081,477 A | 6/2000 | Li | |
| 6,108,266 A | 8/2000 | Weier et al. | |
| 6,137,133 A | 10/2000 | Kauffman et al. | |
| 6,141,247 A | 10/2000 | Roohparvar et al. | |
| 6,157,229 A | 12/2000 | Yoshikawa | |
| 6,160,755 A * | 12/2000 | Norman et al. | 365/233 |
| 6,219,813 B1 | 4/2001 | Bishop et al. | |
| 6,262,921 B1 | 7/2001 | Manning | |
| 6,385,101 B1 | 5/2002 | Chang et al. | |

OTHER PUBLICATIONS

Keeth et al., "DRAM circuit design: a tutorial," IEEE Press, 2001, pp. 16-23, 142-153.

Micron Semiconductor Products, Inc., "2Mb, Smart 5 BIOS-Optimized Boot Block Flash Memory," *Flash Memory* www.micron.com, copyright 2000, Micron Technology, Inc., pp. 1-12.

Micron, "16Mb: x16 SDRAM" *Synchronous DRAM,* www.micron.com, copyright 1999 Micron Technology, Inc. pp. 1-51.

* cited by examiner

ADJUSTABLE TIMING CIRCUIT OF AN INTEGRATED CIRCUIT

CROSS-REFERENCE TO RELATED APPLICATION

This application is a Divisional of U.S. patent application Ser. No. 10/931,427, filed Sep. 1, 2004 and titled, "ADJUSTABLE TIMING CIRCUIT OF AN INTEGRATED CIRCUT," which is a Continuation of U.S. patent application Ser. No. 09/648,857, filed Aug. 25, 2000 now U.S. Pat. No. 6,877,100 and titled, "ADJUSTABLE TIMING CIRCUIT OF AN INTEGRATED CIRCUT," which is commonly assigned and incorporated by reference in its entirety herein.

FIELD OF THE INVENTION

The present invention relates generally to integrated circuits and in particular the present invention relates to adjusting a timing of control signals.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a flash memory. A flash memory is a type of EEPROM that can be erased and reprogrammed in blocks instead of one byte at a time. Many modern personal computers have their BIOS stored on a flash memory chip so that it can easily be updated if necessary. Such a BIOS is sometimes called a flash BIOS. Flash memory is also popular in modems because it enables the modern manufacturer to support new protocols as they become standardized.

A typical flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed on a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile. Many computer systems are designed to operate using SDRAM, but would benefit from non-volatile memory.

Integrated circuits, such as memory devices, include internal signal processing circuits. That is, one or more signals are processed to generate additional internal signals. The timing between these signals can be critical to the operation of the integrated circuit. Because the initial design of internal circuitry is often changed during debugging, the integrated circuit masks must be changed. The economic and time delays of changing the masks are not desirable. Further, structural limitations often result in a compromised solution to problems identified during testing.

For the reasons stated above, and for other reasons stated below which will become apparent to those skilled in the art upon reading and understanding the present specification, there is a need in the art for signal processing and timing circuitry that can be adjusted during and after testing.

SUMMARY OF THE INVENTION

The above-mentioned problems with integrated circuits and other problems are addressed by the present invention and will be understood by reading and studying the following specification.

In one embodiment, an integrated circuit timing circuit comprises a programmable non-volatile fuse circuit, and an adjustable delay element coupled to the programmable non-volatile fuse circuit. The delay element has a plurality of propagation times selectable in response to the programmable non-volatile fuse circuit.

In another embodiment, an integrated circuit timing circuit comprises a programmable non-volatile fuse circuit, a volatile latch circuit coupled to the non-volatile fuse circuit, and a plurality of adjustable delay elements coupled to the volatile latch circuit. Each of the plurality of adjustable delay elements comprises a propagation path, and a plurality of capacitors selectively coupled to the propagation paths of the plurality of adjustable delay elements in response to the volatile latch circuit.

A memory device, in an embodiment, comprises an array of memory cells, access circuitry to generate a plurality of memory array access signals, and an adjustable timing circuit coupled to the access circuitry. The adjustable timing circuit comprises a programmable non-volatile fuse circuit, and an adjustable delay element coupled to the programmable non-volatile fuse circuit. The delay element has a plurality of propagation times selectable in response to the programmable non-volatile fuse circuit.

A method of adjusting a signal timing circuit is provided. The method comprises programming a non-volatile fuse circuit, and selecting a signal propagation time length in response to the programmed non-volatile fuse circuit.

A method is provided to test a memory device having a signal propagation path. The method comprises programming a plurality of non-volatile fuses to store first data, selectively coupling one or more capacitors to the propagation path in response to the first data to provide a first propagation path delay time, and testing the memory using the first propagation path delay time. The plurality of non-volatile fuses are also programmed to store second data, and one or more capacitors are selectively coupled to the propagation path in response to the second data to provide a second propagation path delay time. The memory is then tested using the second propagation path delay time.

DETAILED DESCRIPTION OF THE DRAWINGS

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
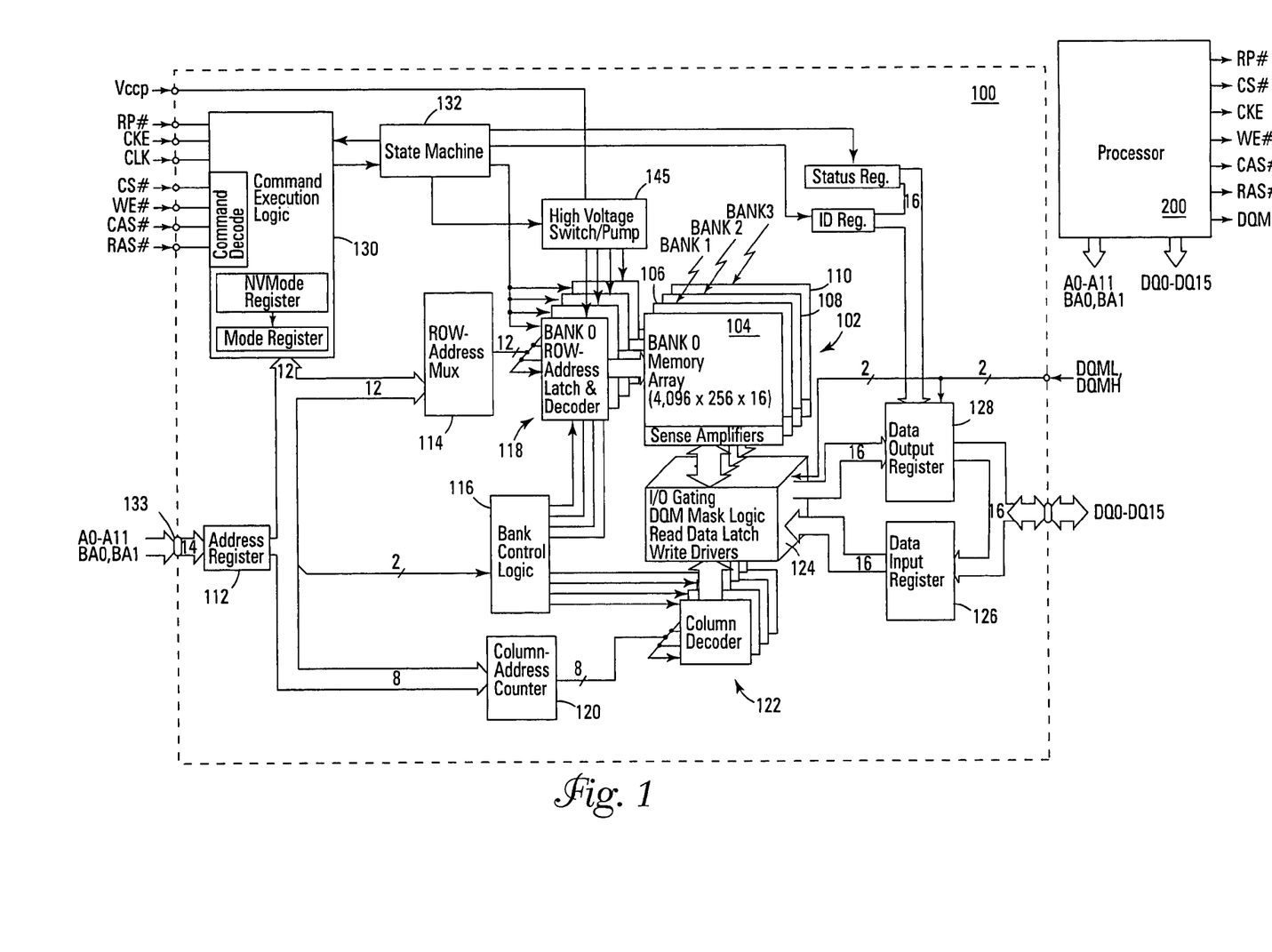
FIG. 1 is a block diagram of a memory incorporating the present invention.

Referring to FIG. 1, a block diagram of one embodiment of the present invention is described. A memory device 100 is coupled to a processor 200. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128. Command execution logic 130 is provided to control the basic operations of the memory device. A state machine 132 is also provided to control specific operations performed on the memory arrays and cells. A status register 134 and an identification register 136 can also be provided to output data. The command circuit 130 and/or state machine 132 can be generally referred to as control circuitry to control read, write, erase and other memory operations.

Figure 2:
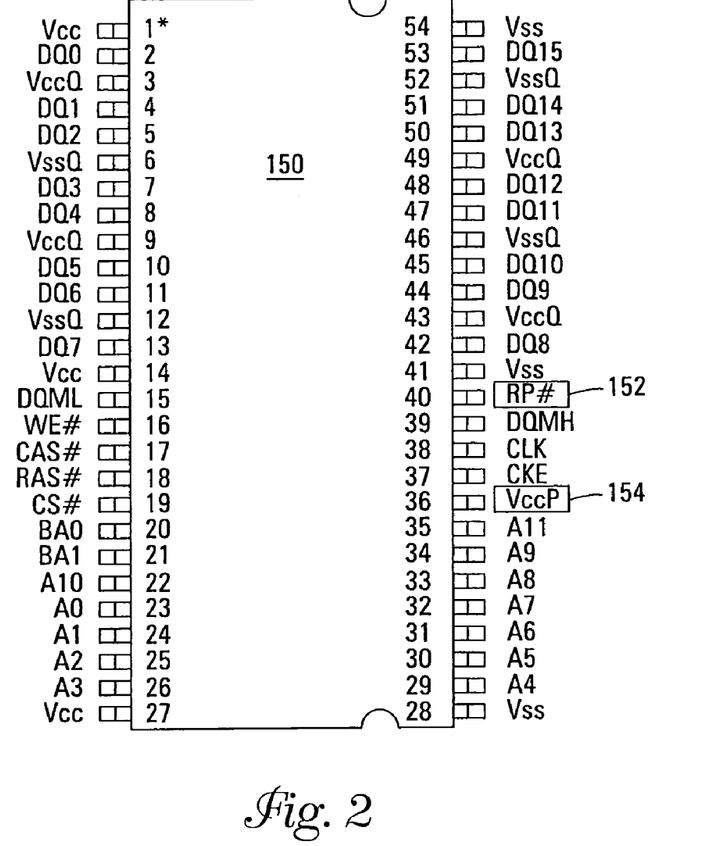
FIG. 2 is an interconnect diagram of one embodiment of the memory of FIG. 1.

FIG. 2 illustrates an interconnect pin assignment of one embodiment of the present invention. The memory package 150 has 54 interconnect pins. The pin configuration is substantially similar to available SDRAM packages. Two interconnects specific to the present invention are RP# 152 and Vccp 154. Although the present invention may share interconnect labels that are appear the same as SDRAM's, the function of the signals provided on the interconnects are described herein and should not be equated to SDRAMs, unless set forth herein. It will be appreciated that the present invention is not limited to a specific package configuration.

Prior to describing the operational features of the memory device, a more detailed description of the interconnect pins and their respective signals is provided. The input clock connection is used to provide a clock signal (CLK). The clock signal can be driven by a system clock, and all synchronous flash memory input signals are sampled on the positive edge of CLK. CLK also increments an internal burst counter and controls the output registers.

The input command input connections for RAS#, CAS#, and WE# (along with CAS#, CS#) define a command that is to be executed by the memory, the timing of internal circuitry coupled to one or more of these inputs can be adjusted as described in detail below. Address inputs 133 are primarily used to provide address signals. In the illustrated embodiment the memory has 12 lines (A0–A11). Other signals can be provided on the address connections, as described below. The address inputs are also used to provide an operating code. Address lines A0–A11 are also used to input mode settings during a mode register load operation.

Bank address input connections, BA0 and BA1 define which bank an active, read, write, or block protect command is being applied. The DQ0–DQ15 connections are data bus connections used for bi-directional data communication. The VCC connection provides a power supply, such as 3V. A ground connection is provided through the Vss connection. Another optional voltage is provided on the VCCP connection. The VCCP connection can be tied externally to VCC, and sources current during device initialization, write and erase operations. That is, writing or erasing to the memory device can be performed using a VCCP voltage, while all other operations can be performed with a VCC voltage. The Vccp connection is coupled to a high voltage switch/pump circuit 145.

One embodiment of the memory is a nonvolatile, electrically sector-erasable (Flash), programmable read-only memory containing 67,108,864 bits organized as 4,194,304 words by 16 bits. Other population densities are contemplated, and the present invention is not limited to the example density. Each memory bank is organized into four independently erasable blocks (16 total). To ensure that critical firmware is protected from accidental erasure or overwrite, the memory can include sixteen 256K-word hardware and software lockable blocks. The memory's four-bank architecture supports true concurrent operations. In general, the synchronous flash memory is configured similar to a multi-bank DRAM that operates at low voltage and includes a synchronous interface.

The memory cells of the above flash memory are floating gate transistors. Floating gate transistors are field-effect transistors (FET) having an electrically isolated (floating) gate that controls electrical conduction between source and drain regions. Data is represented by charge stored on the floating gate and the resulting conductivity obtained between source and drain regions. A programmed memory cell has a higher threshold voltage than an erased memory cell.

For example, a floating gate memory cell can be formed in a P-type substrate with an N-type diffused source region and an N-type drain diffusion formed in the substrate. The spaced apart source and drain regions define an intermediate channel region. A floating gate, typically made of doped polysilicon, is located over the channel region and is electrically isolated from the other cell elements by oxide. For example, a thin gate oxide can be located between the floating gate and the channel region. A control gate is located over the floating gate and can also be made of doped polysilicon. The control gate is separated from the floating gate by a dielectric layer.

Conventionally, a flash cell is programmed by charging the floating gate of the flash cells. The charge is drawn from the flash cells' channel regions into the floating gates by applying relatively high drain-to-source and gate-to-source voltage pulses to the flash cells. During programming, the flash cells generate hot electrons in the channel current that travel at a saturated or maximum velocity, and thus have high energy. Hot electrons arise in the channels of flash cells because the drain-to-source voltages are sufficiently high, and the flash cells' gate lengths are sufficiently small. Hot electrons in the channel current form a programming current used to program the flash cell. The programming current is the flow of hot electrons from a flash cell channel region into its floating gate. Hot electrons can only surmount the energy barrier separating the floating gate and the channel when the energy barrier is reduced by a sufficiently high gate-to-source voltage, such as when the flash cell operates in the linear region. To erase a memory cell, the charge stored on the floating gate is removed.

Signal processing, such as array access signals, in the memory device is controlled using adjustable timing circuitry, explained below. The circuitry includes adjustable delay elements and programmable non-volatile fuses. The fuses can be flash memory cells as described above. The data stored in the non-volatile fuses can be coupled to volatile latches for use during integrated circuit operation. That is, reading a volatile latch can often be performed faster than reading a non-volatile cell.

Figure 3:
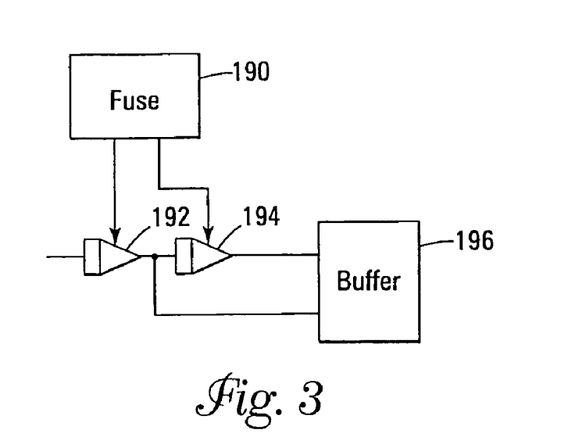
FIG. 3 a block diagram of an adjustable timing circuit of the present invention.

The present invention provides a non-volatile 'fuse' circuit 190 that can be selectively programmed to control timing circuits in an integrated circuit. In one embodiment, the fuse elements 190 are coupled to programmable delay circuits 192 and 194 as illustrated in FIG. 3. The delay elements are arranged in a timing chain and are coupled to latch circuits 196. The latch circuits can be set/re-set latches.

Figure 4:
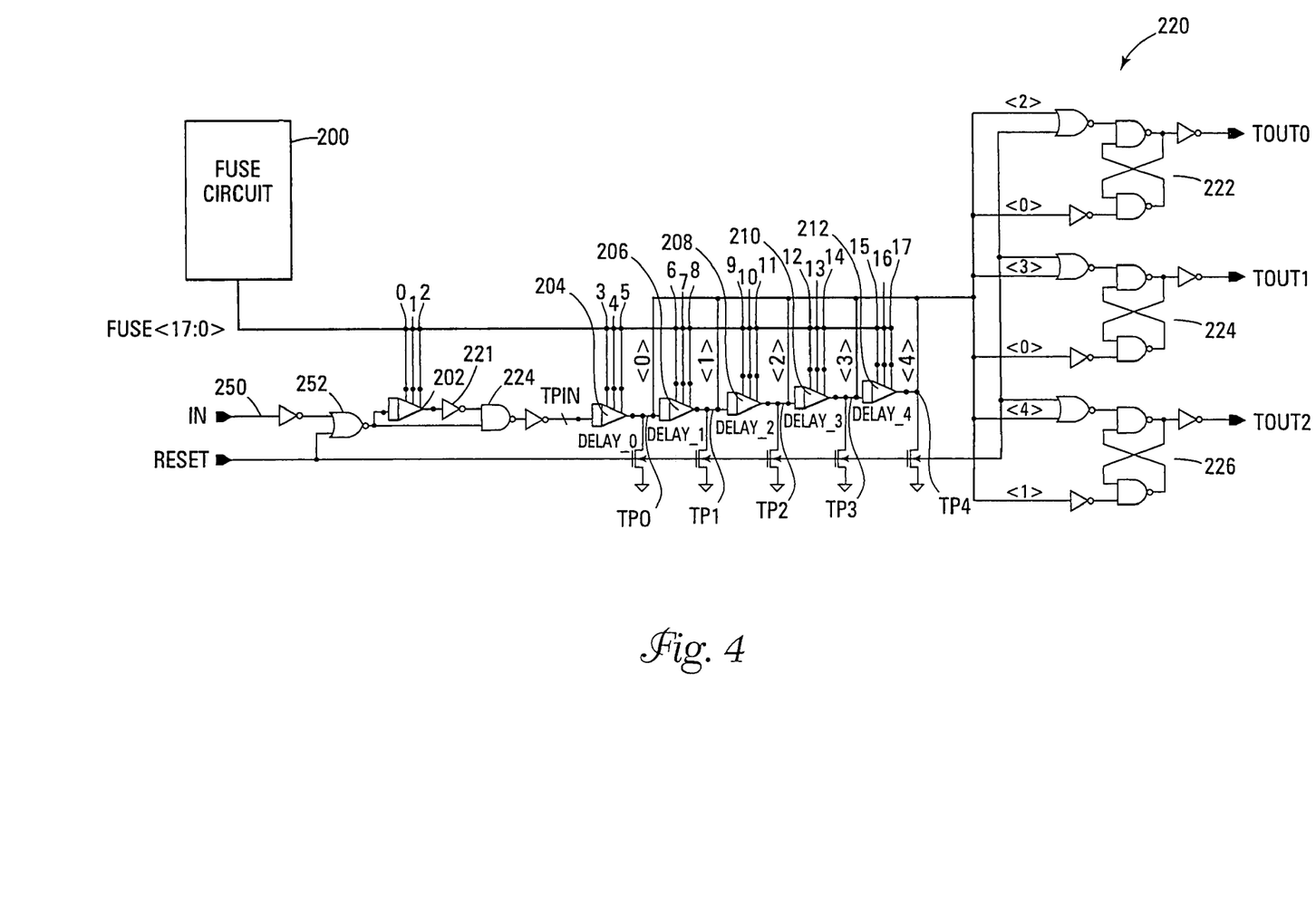
FIG. 4 is a schematic diagram of another an adjustable timing circuit of the present invention.
Figure 5:
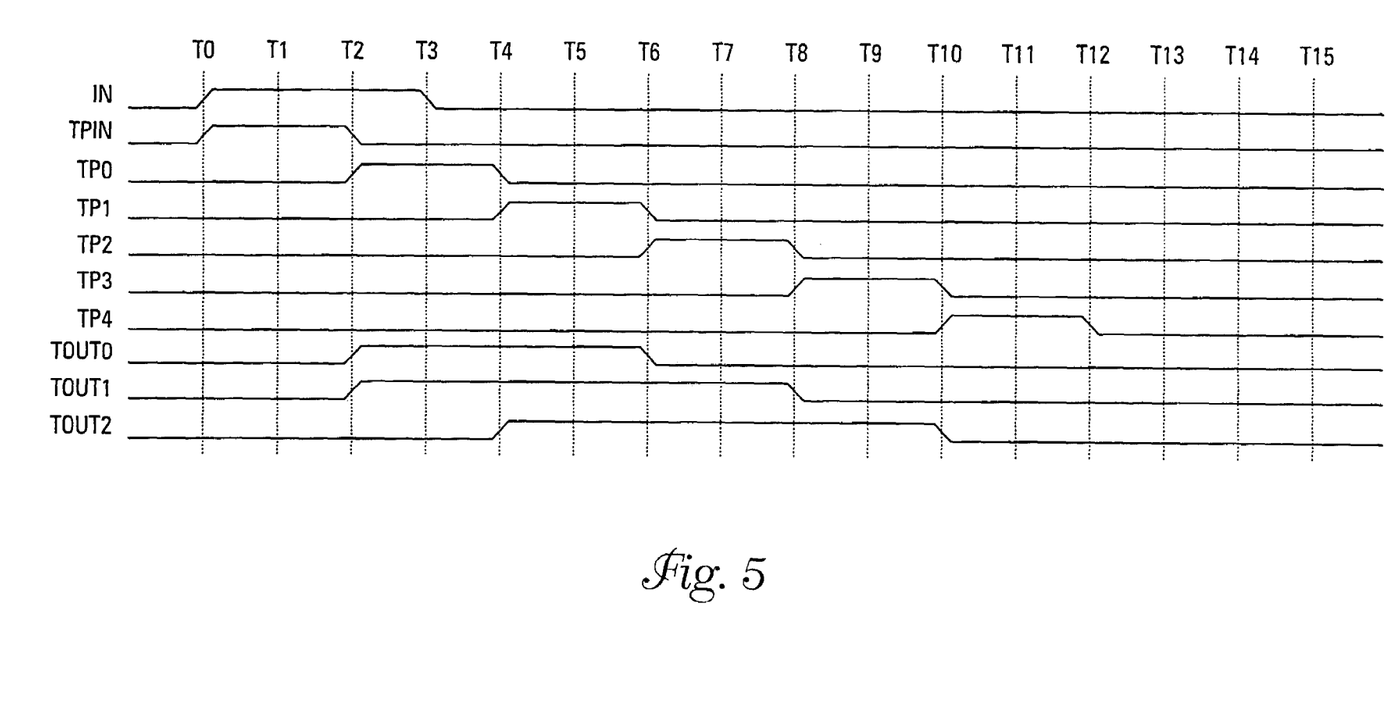
FIG. 5 is a timing diagram of the operation of the circuit FIG. 4.
Figure 6:
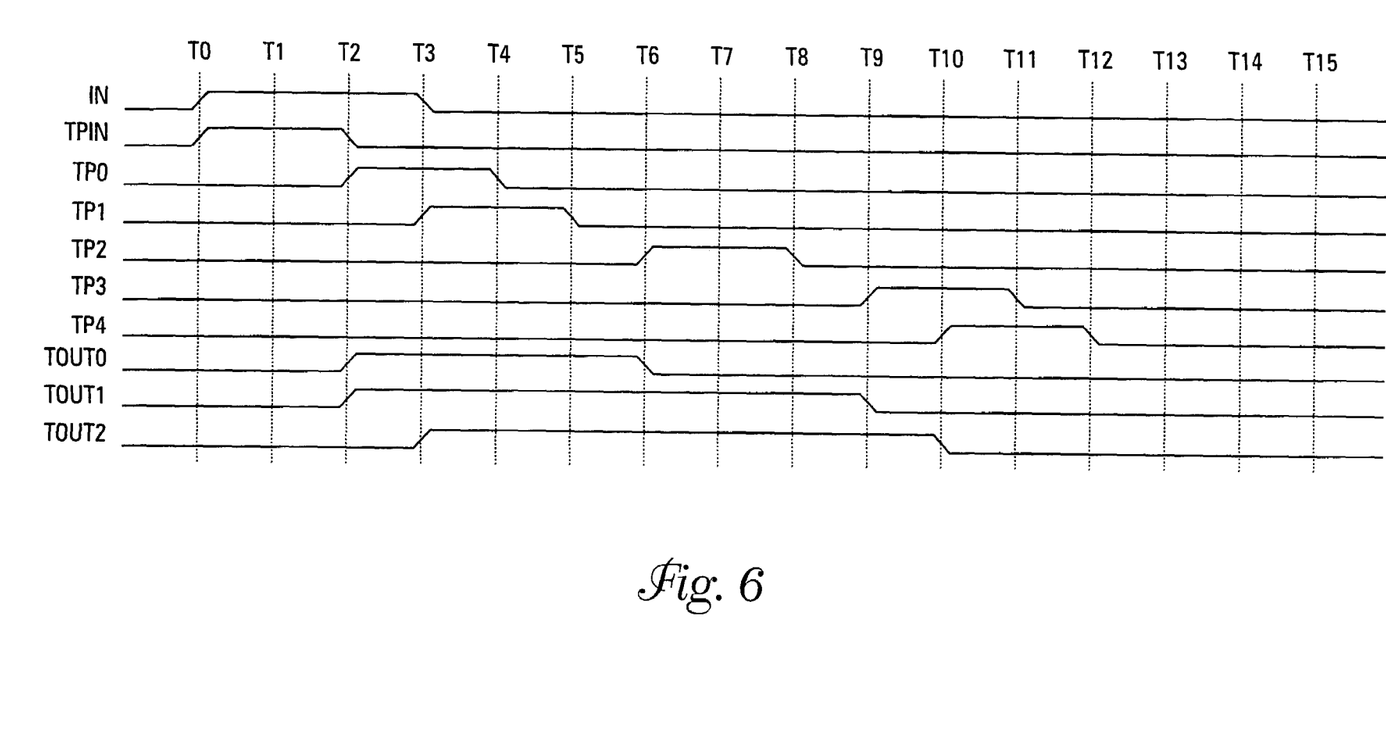
FIG. 6 is another timing diagram of the operation of the circuit FIG. 4.
Figure 7:
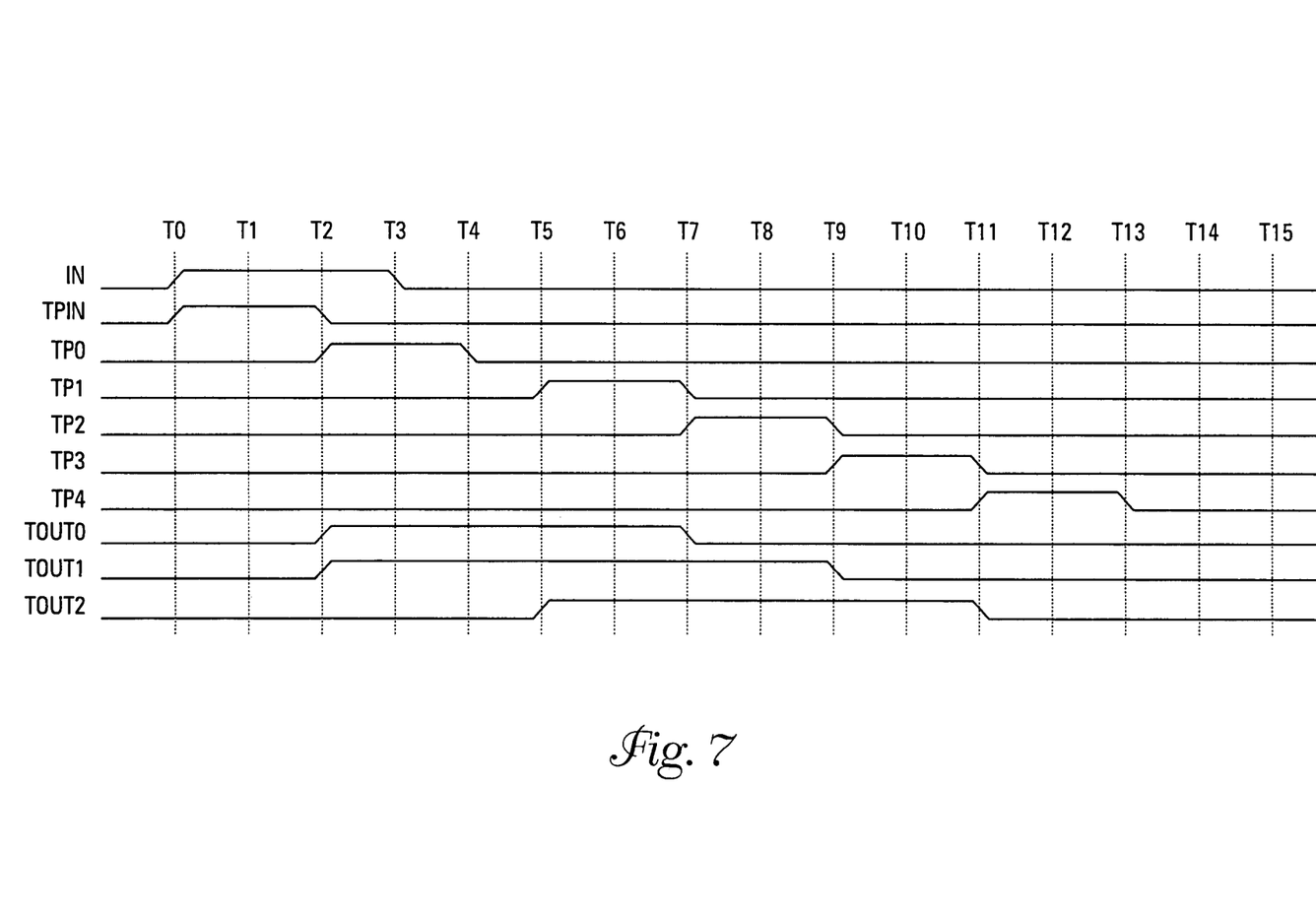
FIG. 7 is another timing diagram of the operation of the circuit FIG. 4.

Referring to FIG. 4, another embodiment of the present invention is described. Non-volatile fuse circuitry 200 is coupled to delay elements 204, 206, 208, 210 and 212. Delay element 204 is coupled to fuses 3, 4 and 5. Each of the delay elements are coupled to three fuses. For example, delay element 212 is coupled to fuses 15, 16 and 17. The delay elements are coupled in series between input 250 and latch circuitry 220. Other circuitry may be coupled to the delay elements. For example, an inverter 221 and a NAND gate 224 are coupled with delay element 202 to form a one-shot signal generator. The output signals from several of the delay elements are coupled to multiple latch circuits 222, 224 and 226. FIGS. 5, 6 and 7 illustrate timing diagrams of the operation of the circuit of FIG. 4. By adjusting the fuse elements 0-17 of the fuse circuit 200, the delay times of the series coupled elements are adjusted to control a propagation time of the delay chain.

In FIG. 5, all of the timing elements have a delay of two time units. That is, a signal transition received on an input of a delay element is coupled to an output of the delay element in two time units. Note, in the following timing diagram, the delay time of the logic gates is assumed to be zero. At T0 an input signal on node 250 transitions from a low state to a high state. The signal is coupled though NOR gate 252 and NAND gate 224 to pull node TPIN high (Reset signal is low). Delay element 202 delays the signal from the second input of NAND gate 224 for two units. After two units, the output of the NAND gate transitions to a low state, time T2. Thus, TPIN is high from TP0 to TP2. Because the delay elements are all set to a common delay time, the two-unit signal is rippled through the delay chain. The first latch circuit 222 is coupled to signals T0 and the output of delay 208 (TP2). As such, TOUT0 transitions high at T2 and the latch is reset at T6 in response to TP2. The second latch circuit 224 is coupled to signals T0 and TP3 (delay 210). As such, TOUT1 transitions high at T2 and latch 224 is reset at T8 in response to TP3. Finally, the third second latch circuit 226 is coupled to signals TP1 and TP4 (output of delay 212). Thus, TOUT2 transitions high at T4 and the latch is reset at T10 in response to TP4.

FIG. 6 illustrates a timing diagram of the circuit of FIG. 4 wherein some of the delay element times are adjusted. Delay elements 206 and 212 are adjusted so that they have a delay of one time unit and delay elements 208 and 210 are adjusted to have a delay of three time units. As illustrated, the TP1 and TP4 signals transition to a high state one time unit following the TP0 and TP3 signal transitions, respectively. Likewise, the TP2 and TP3 signals transition to a high state one time unit following the TP1 and TP2 signal low transitions, respectively. As such, the TOUT1 signal resets at a later time. That is, TOUT1 transitions to a low state at T9 instead of T8. The set transition of TOUT2 has been adjusted to transition to a high state at T3 instead of T4.

Another embodiment of the present invention is illustrated in FIG. 7 where the non-volatile fuse circuit has been programmed to change the delay element times. Here only delay element 206 has been adjusted so that it has a delay of three time units. As illustrated, the TP1 signal transitions to a high state three time units following the TP0 signal high transition. As such, the TOUT0 signal resets at a later time. That is, TOUT0 transitions to a low state at T7 instead of T6. Likewise, both transitions of the TOUT2 signal are shifted out by one time unit. Also, TOUT1 is reset at T9 instead of T8.

Figure 8:
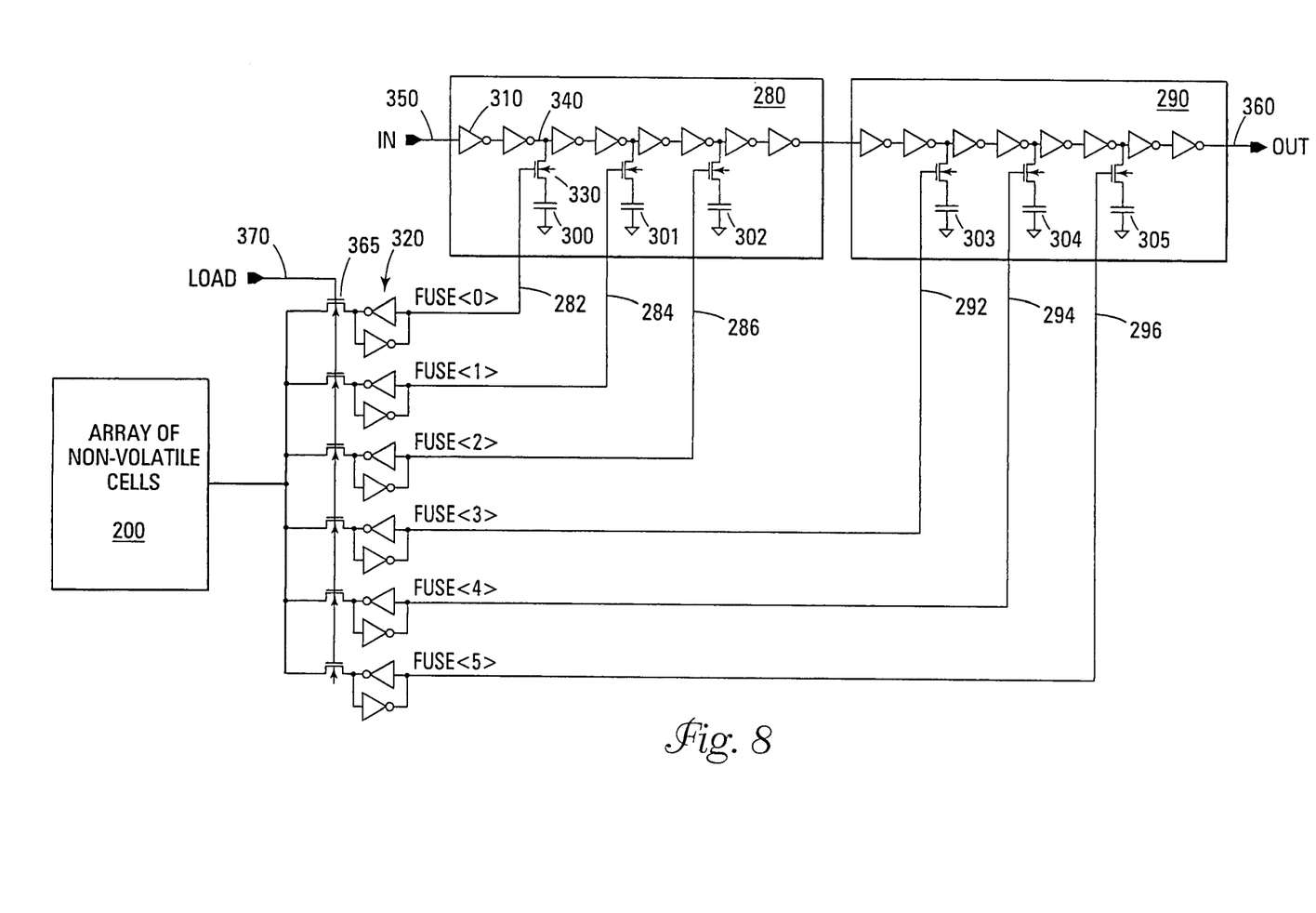
FIG. 8 is a more detailed schematic of an adjustable delay circuit of an embodiment of a present invention.

FIG. 8 illustrates two series coupled delay elements 280 and 290. Each of the delay elements has three input signals to select a delay time. Delay element 280 is coupled to fuses 0, 1 and 2, provided on nodes 282, 284 and 286, respectively. The delay times are controlled by coupling one or more capacitors 300–305 to a signal path of the delay elements 280 and 290. That is, a capacitor can be selectively coupled to series coupled inverters 310 in response to latches 320. Latches 320 are volatile and can be cross-coupled inverters as illustrated. When the latch is programmed to store a logic one, the n-channel transistor 330 couples capacitor 300 to the signal propagation path 340 between input 350 and output 360. Likewise, the transistor is turned off when the latch is programmed as a logic zero. The latch circuit is selectively coupled to a non-volatile fuse circuit 200 via load transistors 365. As such, data stored in the non-volatile fuse elements is copied to the volatile latch when the load transistors are activated via Load signal on node 370. Table 1 illustrates logic states of the six fuses and representative time delays units (assuming zero delay due to propagation through the inverter series). It will be appreciated that the delay units of the series coupled delay elements are cumulative. For example, a delay time of 3 delay units for each delay element results in a total delay time of six delay units.

TABLE 1

| Fuse 0 | Fuse 1 | Fuse 2 | Fuse 3 | Fuse 4 | Fuse 5 | Delay Units |
|---|---|---|---|---|---|---|
| 0 | 0 | 0 | 0 | 0 | 0 | 0 |
| 0 | 0 | 0 | 0 | 0 | 1 | 1 |
| 0 | 0 | 0 | 0 | 1 | 0 | 1 |
| 0 | 0 | 0 | 0 | 1 | 1 | 2 |
| 0 | 0 | 0 | 1 | 0 | 0 | 1 |
| 0 | 0 | 0 | 1 | 0 | 1 | 2 |
| 0 | 0 | 0 | 1 | 1 | 1 | 3 |
| 0 | 0 | 1 | 0 | 0 | 0 | 1 |
| 0 | 1 | 0 | 0 | 0 | 0 | 1 |
| 0 | 1 | 1 | 0 | 0 | 0 | 2 |
| 1 | 0 | 0 | 0 | 0 | 0 | 1 |
| 1 | 0 | 1 | 0 | 0 | 0 | 2 |
| 1 | 1 | 1 | 0 | 0 | 0 | 3 |

The above described embodiments and operating examples should not be construed as limiting the present invention. One skilled in the art, with the benefit of the present description, will understand that changes in the circuitry can be made without departing from the present invention. For example, more complicated latch circuitry can be coupled to the delay element(s). Likewise, the input circuitry can be modified to receive multiple input signals. One application of the present invention is in memory device to adjust timing of signals used to access a memory array. For example, a column address strobe signal can be used in a memory to trigger a series of events during a read operation. The timing of these events can be adjusted using the present invention.

CONCLUSION

An adjustable timing circuit has been described. The timing circuit includes non-volatile programmable fuses and adjustable delay elements. In one embodiment, the data stored in the programmed fuses is copied to volatile latch circuits for use during operation of the timing circuit. The delay element can include capacitors that are selectively coupled to a propagation path in response to the data stored in the fuse circuits. The adjustable timing circuit can be provided in any integrated circuit, but is particularly useful in memory devices. The timing system allows for testing and fine-tuning signal processing in the integrated circuits.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

The invention claimed is:

1. An integrated circuit timing circuit, comprising:
a programmable non-volatile fuse circuit;
a volatile latch circuit coupled to the non-volatile fuse circuit; and
a plurality of adjustable delay elements generating a signal having an edge, each adjustable delay element coupled to the volatile latch circuit, each of the plurality of adjustable delay elements comprises a propagation path, and a plurality of capacitors selectively coupled to the propagation paths of the plurality of adjustable delay elements in response to the volatile latch circuit; and
a plurality of set/reset flip-flops triggered off of a signal edge or a predetermined number of delay elements and reset by other edges or numbers of delay elements.

2. The integrated circuit timing circuit of claim 1, wherein the plurality of capacitors are selectively coupled to the propagation paths via a switch activated by the volatile latch circuit.

3. The integrated circuit timing circuit of claim 1, and further comprising:
logic circuitry coupled to an input of the plurality of adjustable delay elements; and
latch circuitry coupled to an output of the plurality of adjustable delay elements.

4. The integrated timing circuit of claim 1, wherein the delay elements are configured to adjust one of: an edge position of at least one signal relative to other edges of the signal, a plurality of edge positions of a signal relative to other edges of the signal, or a duration of a single signal relative to other signals.

5. The integrated timing circuit of claim 1, wherein the programmable non-volatile fuse circuit comprises a plurality of flash memory cells.

6. A synchronous flash memory device, comprising:
an array of non-volatile memory cells;
access circuitry to generate a plurality of memory array access signals; and
an adjustable timing circuit coupled to the access circuitry, the adjustable timing circuit comprising:
a programmable non-volatile fuse circuit comprising non-volatile memory cells,
a volatile latch circuit coupled to the non-volatile fuse circuit, and
a plurality of adjustable delay elements generating a signal having an edge, each adjustable delay element coupled to the volatile latch circuit, each of the plurality of adjustable delay elements comprises a propagation path, and a plurality of capacitors selectively coupled to the propagation paths of the plurality of adjustable delay elements in response to the volatile latch circuit;
a plurality of set/reset flip-flops triggered off of a signal edge or a predetermined number of delay elements and reset by other edges or numbers of delay elements.

7. The flash memory of claim 6, wherein the plurality of capacitors are selectively coupled to the propagation paths via a switch activated by the volatile latch circuit.

8. The flash memory of claim 6, and further comprising:
logic circuitry coupled to an input of the plurality of adjustable delay elements; and
latch circuitry coupled to an output of the plurality of adjustable delay elements.

9. The flash memory of claim 6, wherein the delay elements are configured to adjust one of: an edge position of at least one signal relative to other edges of the signal, a plurality of edge positions of a signal relative to other edges of the signal, or a duration of a single signal relative to other signals.

10. The flash memory of claim 6, wherein the programmable non-volatile fuse circuit comprises a plurality of flash memory cells.

11. A processing system, comprising:
a processor; and
a synchronous flash memory device coupled to the processor to store data provided by the processor and to provide data to the processor, the memory comprising:
an array of non-volatile memory cells;
access circuitry to generate a plurality of memory array access signals; and
an adjustable timing circuit coupled to the access circuitry, the adjustable timing circuit comprising:
a programmable non-volatile fuse circuit comprising non-volatile memory cells,
a volatile latch circuit coupled to the non-volatile fuse circuit,
a plurality of adjustable delay elements generating a signal having an edge, each adjustable delay element coupled to the volatile latch circuit, each of the plurality of adjustable delay elements comprises a propagation path, and a plurality of capacitors selectively coupled to the propagation paths of the plurality of adjustable delay elements in response to the volatile latch circuit; and
a plurality of set/reset flip-flops triggered off of a signal edge or a predetermined number of delay elements and reset by other edges or numbers of delay elements.

12. The processing system of claim 11, wherein the plurality of capacitors are selectively coupled to the propagation paths via a switch activated by the volatile latch circuit.

13. The processing system of claim 11, and further comprising:
logic circuitry coupled to an input of the plurality of adjustable delay elements; and
latch circuitry coupled to an output of the plurality of adjustable delay elements.

14. The processing system of claim 4, wherein the delay elements are configured to adjust one of: an edge position of at least one signal relative to other edges of the signal, a plurality of edge positions of a signal relative to other edges of the signal, or a duration of a single signal relative to other signals.

15. The processing system of claim 4, wherein the programmable non-volatile fuse circuit comprises a plurality of flash memory cells.

* * * * *